United States Patent
Crouzevialle

(10) Patent No.: US 12,146,918 B2
(45) Date of Patent: Nov. 19, 2024

(54) METHOD FOR DETERMINING THE STATE OF CHARGE OF THE CELLS OF A BATTERY

(71) Applicant: Commissariat à l'Énergie Atomique et aux Énergies Alternatives, Paris (FR)

(72) Inventor: Bruno Crouzevialle, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 206 days.

(21) Appl. No.: 17/627,595

(22) PCT Filed: Jul. 10, 2020

(86) PCT No.: PCT/EP2020/069677
§ 371 (c)(1),
(2) Date: Jan. 14, 2022

(87) PCT Pub. No.: WO2021/009086
PCT Pub. Date: Jan. 21, 2021

(65) Prior Publication Data
US 2022/0268847 A1    Aug. 25, 2022

(30) Foreign Application Priority Data
Jul. 18, 2019  (FR) ..................... 1908115

(51) Int. Cl.
*G01R 31/396*   (2019.01)
*G01R 31/36*    (2020.01)
(Continued)

(52) U.S. Cl.
CPC ..... *G01R 31/3835* (2019.01); *G01R 31/3648* (2013.01); *G01R 31/396* (2019.01); *H02J 7/0048* (2020.01); *H02J 7/007* (2013.01)

(58) Field of Classification Search
CPC ............ G01R 31/3835; G01R 31/3648; G01R 31/396; H02J 7/0048
(Continued)

(56) References Cited

U.S. PATENT DOCUMENTS 6,512,984 B1 *  1/2003  Suzuki ............ G01R 19/16542
                                                    702/63
2012/0293131 A1  11/2012  Nakamura et al.
(Continued)

FOREIGN PATENT DOCUMENTS

DE   10 2013 217 752 A1   3/2015
FR       3 018 360 A1     9/2015
FR       3 054 669 A1     2/2018

OTHER PUBLICATIONS

International Search Report and Written Opinion for International Application No. PCT/EP2020/069677, mailed Oct. 15, 2020.

*Primary Examiner* — Ricky Go
(74) *Attorney, Agent, or Firm* — Wolf, Greenfield & Sacks, P.C.

(57) ABSTRACT

A method of determining, for each cell of a battery of series-coupled cells, an indicator $QC_i$ representative of the charge stored in the cell, this method comprising: a) at the end of a phase of partial discharge or charge of the battery, measuring the voltage $U_i$ across each cell of the battery; b) calculating, for each cell, an interpolation coefficient $X_i$ from a value C_rate representative of the discharge or charge rate of the battery during said partial discharge or charge phase, and from the voltages $U_i$ measured at step a); and c) determining, for each cell, from the interpolation coefficient $X_i$ calculated for the cell at step b) and from a quantity $Q_{cm}$ representative of the charge stored in the battery, said indicator $QC_i$ representative of the charge stored in cell.

8 Claims, 1 Drawing Sheet

(51) Int. Cl.
*G01R 31/3835* (2019.01)
*H02J 7/00* (2006.01)

(58) Field of Classification Search
USPC .......................................................... 702/63
See application file for complete search history.

(56) References Cited

U.S. PATENT DOCUMENTS

| | | | |
|---|---|---|---|
| 2012/0310563 A1* | 12/2012 | Shigemizu | G01R 31/3828 |
| | | | 702/63 |
| 2014/0172334 A1* | 6/2014 | Cappuccino | G01R 31/385 |
| | | | 702/63 |
| 2014/0184169 A1 | 7/2014 | Tsuru et al. | |
| 2014/0184236 A1 | 7/2014 | Ohkawa et al. | |
| 2019/0202385 A1* | 7/2019 | Lo | H01M 4/583 |
| 2020/0036197 A1* | 1/2020 | Tan | H01M 10/441 |

* cited by examiner

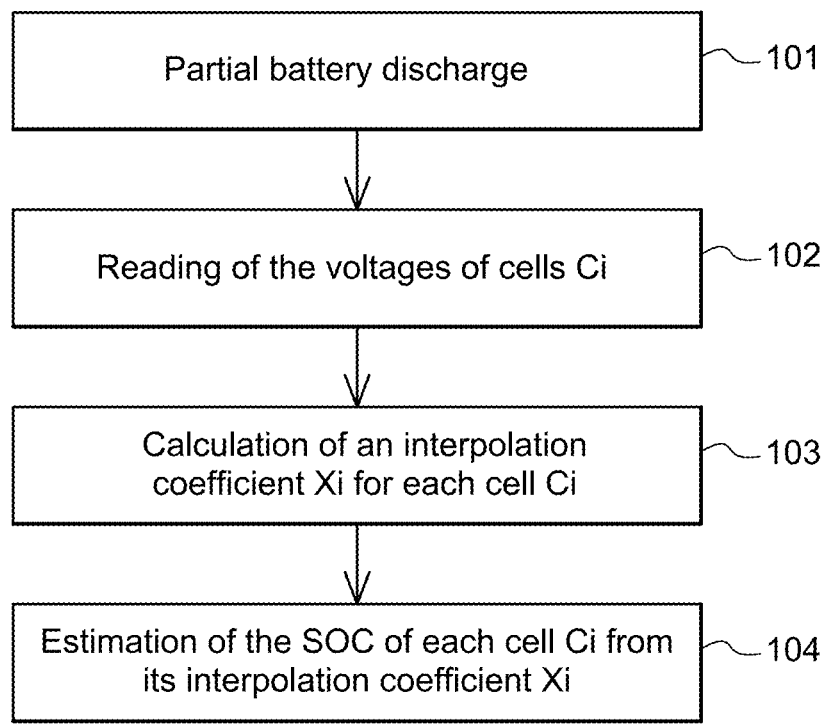

METHOD FOR DETERMINING THE STATE OF CHARGE OF THE CELLS OF A BATTERY

This Application is a national stage filing under 35 U.S.C. § 371 of International Patent Application Serial No. PCT/EP2020/069677, filed Jul. 10, 2020, which claims priority to French patent application FR19/08115, filed Jul. 18, 2019. The contents of which are incorporated herein by reference in their entirety.

TECHNICAL BACKGROUND

The present disclosure concerns the field of electric batteries, and more particularly aims at determining the state of charge of the cells of a battery.

PRIOR ART

An electric battery is a group of a plurality of rechargeable cells coupled in series and/or in parallel between two voltage supply nodes or terminals.

In certain applications, it is desired to be able to estimate, for each cell of a battery, an indicator representative of the state of charge of the cell, generally called SOC. At a given time, the SOC can be defined as being the ratio of the quantity of charges remaining in the cell, or residual capacity of the cell (that is the number of amperes-hour still available in the cell), to the total capacity of the battery.

Knowing the SOC of each cell may for example enable to identify defective cells to isolate or replace them. In particular, in the case of a significant state of charge difference between different cells at a given time, the user may be warned that certain cells may be defective. Knowing the SOC of each cell may further be useful to perform a sorting of the cells in applications of recycling of used electric batteries.

SUMMARY

An embodiment provides a method of determining, for each cell of a battery comprising a plurality of series-coupled cells, an indicator QCi representative of the charge stored in the cell, this method comprising the steps of:
a) at the end of a phase of partial discharge or charge of the battery, measuring the voltage Ui across each cell of the battery;
b) calculating, for each cell, an interpolation coefficient Xi from a value C_rate representative of the battery discharge or charge rate during said partial discharge or charge phase, and from the voltages Ui measured at step a); and
c) determining, for each cell, from the interpolation coefficient Xi calculated for the cell at step b) and from a quantity Qcm representative of the charge stored in the battery, said indicator QCi representative of the charge stored in the cell.

According to an embodiment of the present invention, for each cell, the interpolation coefficient Xi calculated at step b) is a function of the voltage Ui of the cell measured at step a), of value C_rate, of a value Umin defined as being the lowest value of the voltages Ui measured at step a), of a value Umax defined as being the highest voltage of the voltages Ui measured at step b), and of a value Umoy defined as being the average of the voltages Ui measured at step b).

According to an embodiment of the present invention, for each cell, the interpolation coefficient Xi calculated at step b) is defined as follows:

$$Xi = (K + B*D*C + B*D*E - B*A)/K \qquad \text{[Math. 1]}$$

where A, B, C, D, E, and K are parameters defined as follows:

$$K = (Umoy^2 *(1 + S*C\_rate))/(2*C\_rate) \qquad \text{[Math. 2]}$$
$$A = Umax - Ui \qquad \text{[Math. 3]}$$
$$B = Ui - Umin \qquad \text{[Math. 4]}$$
$$C = Ui/Umin \qquad \text{[Math. 5]}$$
$$D = Ui/Umax \qquad \text{[Math. 6]}$$
$$E = (Umax - Umin)/Ui \qquad \text{[Math. 7]}$$

where S designates the sign of the discharge or charge current applied to the battery at step a).

According to an embodiment of the present invention, for each cell, at step c), indicator QCi is calculated according to the following formula:

$$QCi = Xi*Qcm \qquad \text{[Math. 8]}$$

According to an embodiment of the present invention, the method further comprises, after step c), the provision, for each cell of the battery, of an indicator SOCCi representative of the state of charge of the cell, calculated from the indicator QCi calculated for the cell at step c) and from a quantity Qtot representative of the capacity of the battery.

According to an embodiment of the present invention, for each cell, indicator SOCCi is defined as follows:

$$SOCCi = QCi/Qtot \qquad \text{[Math. 9]}$$

According to an embodiment of the present invention, the method further comprises, before step a), a phase of determination of quantity Qtot comprising a step of residual charge of the battery up to its full charge level followed by a step of full discharge of the battery, or a step of residual discharge of the battery down to its full discharge level followed by a step of full charge of the battery.

Another embodiment provides a method of recycling used battery cells comprising a step of diagnosis of the cells implementing a method such as defined hereabove, followed by a step of selection of cells having an indicator QCi satisfying a predefined condition.

According to an embodiment of the present invention, the method further comprises a step of assembly of the selected cells in a new battery.

Another embodiment provides a method of characterization of an electric battery on a cycling test bench, comprising the implementation of a method such as defined hereabove.

BRIEF DESCRIPTION OF THE DRAWINGS

The foregoing and other features and advantages of the present invention will be discussed in detail in the following non-limiting description of specific embodiments in connection with the accompanying drawing:

FIG. 1 is a flowchart illustrating, in the form of blocks, an example of a method of determining the state of charge of the cells of a battery according to an embodiment.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the various uses that may be made of the SOC of the cells of a battery have not been detailed. Further, the electronic measurement and processing circuits used to implement the provided method of determining the SOC of the cells of a battery have not been detailed, the forming of such circuits being within the abilities of those skilled in the art based on the indications of the present description.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

Unless specified otherwise, the expressions "around", "approximately", "substantially" and "in the order of" signify within 10%, and preferably within 5%.

The determination of the SOC of the cells of a battery comprising a plurality of cells series-coupled between a positive terminal and a negative terminal of the battery is here more particularly considered. The battery cells are preferably identical to within manufacturing and aging dispersions. Each cell may comprise a single elementary cell of cell, accumulator, or other type or a plurality of elementary cells coupled in series and/or in parallel between a positive terminal and a negative terminal of the cell. The elementary cells are for example lithium cells, for example cells of lithium-ion, lithium-metal-polymer type, etc. More generally, the described embodiments apply to all or most known elementary battery cell technologies.

FIG. 1 is a flowchart illustrating, in the form of blocks, an example of a method of determining the state of charge of the cells of a battery according to an embodiment.

A battery (not shown) comprising n cells C1, . . . , Cn series-coupled between a positive terminal and a negative terminal of the battery, n being an integer greater than or equal to 2, for example, greater than or equal to 3, is considered in this example.

A SOC determination tool (not shown) is connected to the battery, this tool comprising n voltage sensors respectively connected across the n cells $C_i$ of the battery, i being an integer in the range from 1 to n. Each voltage sensor is adapted to measuring the voltage $U_i$ across the cell $C_i$ with which it is associated. The SOC determination tool may further comprise a coulometer or a current integrator connected to at least a terminal of the battery, or any other element enabling to measure or to estimate the charge extracted from the battery during a battery discharge phase or injected into the battery during a battery charge phase. The SOC determination tool further comprises means for storing (memory, register, etc.) at least one set of n voltage values $U_i$ respectively measured across the n cells $C_i$ of the battery at a given time. The SOC determination tool may further comprise a processing unit capable of comprising a microprocessor. In practice, the SOC determination tool may form part of an electronic battery management device integrated to the battery, generally designated with term BMS, for "Battery Management System", intended to implement various functions such as cell balancing functions, protection functions, etc. Indeed, the above-mentioned components of the SOC determination tool are components which are conventionally present in a BMS-type battery management device. As a variant, the SOC determination tool may be a device external to the battery, intended to be connected to the battery during a phase of determination of the SOC of the battery cells. In another variant, the SOC determination tool may be partially integrated to the battery and partially external to the battery. For example, the voltage sensors of the SOC determination tool may be internal to the battery, and the processing device implementing the described method based on the voltage values delivered by the sensors may be external to the battery. The SOC determination tool is configured to implement the method of FIG. 1 of determination of the state of charge of the battery cells.

The method of FIG. 1 comprises a step 101 during which the battery is submitted to a partial discharge, for example, at a constant current and at a constant ambient temperature.

At the end of the partial discharge phase, during a step 102, the SOC determination tool reads and stores voltages $U_i$ across the different battery cells. The n voltages $U_i$ are for example read in parallel (that is, simultaneously) and stored in a register or a memory of the SOC determination tool. During step 102, the SOC determination tool determines and further stores a quantity Qcm representative of the charge quantity remaining in the battery at the end of the phase of partial discharge of step 101. As an example, the SOC determination tool is configured to measure all the charge variations of the battery during the battery discharge or charge phases, which enables it to know value Qcm.

During a step 103, for each of the battery cells $C_i$, the SOC determination tool calculates an interpolation coefficient $X_i$ specific to the cell, which is a function of the voltage $U_i$ of the cell stored at step 102, of the discharge rate C_rate of the battery during the phase of partial discharge of step 101 (discharge current applied to the battery during step 101), as well as of the voltages across one or a plurality of other cells of the battery stored at step 102.

In this example, interpolation coefficient $X_i$ is a function of the voltage $U_i$ of the cell stored at step 102, of the discharge rate C_rate of the battery cells during the phase of partial discharge of step 101, of a value Umin defined as being the lowest voltage of the set of voltages $U_i$ stored at step 102, of a value Umax defined as being the highest voltage of the set of voltages $U_i$ stored at step 102, and of a voltage Umoy defined as being the average of the voltages $U_i$ stored at step 102.

Discharge rate C_rate here means the ratio of the discharge current Idch of the battery, in amperes, during the phase of partial discharge of step 101 (or the average value of the discharge current in the case where the discharge current is not constant during discharge phase 101) to the initial capacity Qinit of an elementary cell of the battery, that is, its capacity when new, in amperes-hour (for example, the nominal capacity of the cell such as provided by the manufacturer).

As an example, the duration of the phase of partial discharge may be in the range from a few seconds to a few minutes, for example, from 1 second to 10 minutes. When the duration of the phase of partial discharge is long, for example greater than 10 seconds, and the discharge current Idch of the battery during the partial discharge phase exhibits significant variations, for example, greater than 20 percents, the calculation of discharge rate C_rate is based on the value of the discharge current Idch measured at the end of the phase of partial discharge, and not on an average value of the discharge current Idch during the partial discharge phase.

In this example, interpolation coefficient Xi is defined as follows:

$$Xi = (K + B*D*C + B*D*E - B*A)/K \qquad \text{[Math. 10]}$$

where A, B, C, D, E, and K are parameters defined as follows:

$$K = (Umoy^2 * (1 + C\_rate))/(2 * C\_rate) \qquad \text{[Math. 11]}$$

$$A = Umax - Ui \qquad \text{[Math. 12]}$$

$$B = Ui - Umin \qquad \text{[Math. 13]}$$

$$C = Ui/Umin \qquad \text{[Math. 14]}$$

$$D = Ui/Umax \qquad \text{[Math. 15]}$$

$$E = (Umax - Umin)/Ui \qquad \text{[Math. 16]}$$

During a step 104, for each cell Ci of the battery, once the interpolation coefficient Xi of the cell has been determined, the SOC determination tool calculates a value QCi representative of the quantity of charge remaining in the cell based on the interpolation coefficient Xi of the cell, according to the following formula:

$$QCi = Xi * Qcm \qquad \text{[Math. 17]}$$

Knowing the quantity of charge QCi available in the cell, its SOC may be calculated by the SOC determination tool, for example, according to the following formula:

$$SOCCi = QCi/Qtot \qquad \text{[Math. 18]}$$

where Qtot designates the battery capacity.

Capacity Qtot may be determined during a prior phase, not shown in FIG. 1. As an example, the determination of capacity Qtot may comprise a phase of residual charge of the battery up to its full charge level, followed by a phase of full discharge of the battery. The SOC determination tool then measures the value of the charge Q extracted from the battery between the beginning and the end of the phase of full discharge, which defines the battery capacity Qtot. As a variant, the determination of capacity Qtot may comprise a phase of residual discharge of the battery down to its full discharge level, followed by a phase of full charge of the battery up to its full charge level. The SOC determination tool then measures the value of the charge Q injected into the battery between the beginning and the end of the phase of full charge, which defines the battery capacity Qtot. Capacity Qtot does not need being updated at each iteration of the method of FIG. 1. However, capacity Qtot is preferably regularly measured to take into account the aging of the battery. As a variant, the capacity Qtot considered in the method of FIG. 1 is a constant fixed value for example corresponding to the capacity value provided by the battery constructor.

An advantage of the method described in relation with FIG. 1 is that it enables to individually estimate the state of charge of the different cells of a battery based on a simple measurement of the voltages across the different cells at the end of a phase of partial discharge of the battery, without having to acquire and record the discharge curves of the different battery cells during the discharge phase and without having to use libraries of characterization curves.

As an example, the SOC of each of cells Ci may be periodically estimated, by the method of FIG. 1, all along a phase of full discharge of the battery, for example, at a constant current and at a constant ambient temperature. This enables to obtain, for each cell Ci, a curve representative of the variation of the SOC of the cell all along the discharge phase. Such a curve may for example be used to identify possible behavior differences between the different cells, and thus to identify possible defective cells.

This method may for example be implemented by a management device integrated to the battery, during the normal battery life cycle, for example, to monitor the state of the different battery cells, for example to schedule possible battery maintenance operations, to optimize the use of the battery, or to prevent a possible malfunction.

Another application of the provided method concerns the diagnosis of the cells of a used battery for their recycling. As an example, once the state of charge indicators of the different cells have been determined by the provided method, it may be provided to sample the cells having a SOC satisfying a predefined condition, for example, the cells having a SOC greater than a threshold, for example, to reassemble them in a new battery. The other cells are for example recycled by recovery of the metals forming them. It should be noted that, if the used batteries to be recycled do not have a series architecture, the latter can be disassembled and their cells may be reassembled in series to implement the above-described selection method.

Another application of the provided method concerns the characterization of batteries on cycling test benches on design thereof. The provided method may be applied on a cycling test bench to follow the variation and the dispersion of the SoC of the cells during the characterization tests.

Although a method of determination of the SOC of the cells implemented from a phase of partial discharge of the battery has been described hereabove, in relation with FIG. 1, a similar method may be implemented from a partial charge of the battery. In this case, the method is identical to what has been described hereabove, with the difference that the definition of coefficient K (equation Math 11 hereabove) is modified as follows:

$$K = (Umoy^2 * (1 - C\_rate))/(2 * C\_rate) \qquad \text{[Math. 19]}$$

In other words, the definition of coefficient K can be generalized as follows:

$$K = (Umoy^2 * (1 + S * C\_rate))/(2 * C\_rate) \qquad \text{[Math. 20]}$$

where S designates the sign of the current flowing through the battery at the time of the measurement of the voltages Ui of the battery cells (that is, at the end of step 101).

Specific embodiments have been described. Various alterations and modifications will occur to those skilled in the art. In particular, the described embodiments are not limited to the specific example of definition of the estimator of the state of charge of equation Math 18. As a variant, for each cell Ci, the estimator calculated at step 104 may be any estimator directly or indirectly representative of the state of charge of the cell, for example, an estimator of the state of discharge (SOD) or of the depth of discharge (DOD), or also an estimator of the state of energy (SOE).

The invention claimed is:

1. A method of determining, for each cell of a battery comprising a plurality of series-coupled cells, of an indicator QCi representative of the charge stored in the cell, the method comprising the steps of:
   a) at the end of a phase of partial discharge or charge of the battery, measuring the voltage Ui across each cell of the battery;
   b) calculating, for each cell, an interpolation coefficient Xi from a value C_rate representative of the battery discharge or charge rate during said partial discharge or charge phase, and from the voltages Ui measured at step a); and
   c) determining, for each cell, from the interpolation coefficient Xi calculated for the cell at step b) and from a quantity Qcm representative of the charge stored in the battery, said indicator QCi representative of the charge stored in the cell,
   wherein for each cell, the interpolation coefficient Xi calculated at step b) is a function of the voltage Ui of the cell measured at step a), of value C_rate, of a value Umin defined as being the lowest value of the voltages Ui measured at step a), of a value Umax defined as being the highest voltage of the voltages Ui measured at step b), and of a value Umoy defined as being the average of the voltages Ui measured at step b),
   wherein the method is implemented by a management device integrated to the battery, to monitor the state of the different battery cells, to schedule possible battery maintenance operations, to optimize the use of the battery, or to prevent a possible malfunction.

2. The method according to claim 1, wherein, for each cell, the interpolation coefficient Xi calculated at step b) is defined as follows:

$$Xi = (K + B*D*C + B*D*E - B*A)/K$$

where A, B, C, D, E, and K are parameters defined as follows:

$$K = (Umoy^2 * (1 + S*C\_rate))/(2*C\_rate)$$
$$A = Umax - Ui$$
$$B = Ui - Umin$$
$$C = Ui/Umin$$
$$D = Ui/Umax$$
$$E = (Umax - Umin)/Ui$$

where S designates the sign of the discharge or charge current applied to the battery at step a).

3. The method according to claim 1, wherein, for each cell, at step c), indicator QCi is calculated according to the following formula:

$$QCi = Xi*Qcm$$

4. The method according to claim 1, further comprising, after step c), the provision, for each cell of the battery, of an indicator SOCCi representative of the state of charge of the cell, calculated from the indicator QCi calculated for the cell at step c) and from a quantity Qtot representative of the battery capacity.

5. The method according to claim 4, wherein, for each cell, indicator SOCCi is defined as follows:

$$SOCCi = QCi/Qtot$$

6. The method according to claim 4, further comprising, before step a), a phase of determination of quantity Qtot comprising a step of residual charge of the battery up to its full charge level followed by a step of full discharge of the battery, or a step of residual discharge of the battery down to its full discharge level followed by a step of full charge of the battery.

7. A method of recycling used battery cells comprising a step of diagnosis of the cells implementing a method of determining, for each cell of a battery comprising a plurality of series-coupled cells, of an indicator QCi representative of the charge stored in the cell, the method of determining comprising the steps of:
   a) at the end of a phase of partial discharge or charge of the battery, measuring the voltage Ui across each cell of the battery;
   b) calculating, for each cell, an interpolation coefficient Xi from a value C_rate representative of the battery discharge or charge rate during said partial discharge or charge phase, and from the voltages Ui measured at step a);
   c) determining, for each cell, from the interpolation coefficient Xi calculated for the cell at step b) and from a quantity Qcm representative of the charge stored in the battery, said indicator QCi representative of the charge stored in the cell,
   wherein for each cell, the interpolation coefficient Xi calculated at step b) is a function of the voltage Ui of the cell measured at step a), of value C_rate, of a value Umin defined as being the lowest value of the voltages Ui measured at step a), of a value Umax defined as being the highest voltage of the voltages Ui measured at step b), and of a value Umoy defined as being the average of the voltages Ui measured at step b),
   followed by a step of selection of cells having an indicator QCi satisfying a predefined condition, and
   the method of recycling further comprising a step of assembly of the selected cells in a new battery.

8. A method of characterization of an electric battery comprising a plurality of series-coupled cells on a cycling test bench, comprising the implementation of a method of determining, for each cell of the battery, of an indicator QCi representative of the charge stored in the cell, the method of determining comprising the steps of:

a) at the end of a phase of partial discharge or charge of the battery, measuring the voltage Ui across each cell of the battery;
b) calculating, for each cell, an interpolation coefficient Xi from a value C_rate representative of the battery discharge or charge rate during said partial discharge or charge phase, and from the voltages Ui measured at step a); and
c) determining, for each cell, from the interpolation coefficient Xi calculated for the cell at step b) and from a quantity Qcm representative of the charge stored in the battery, said indicator QCi representative of the charge stored in the cell,
wherein for each cell, the interpolation coefficient Xi calculated at step b) is a function of the voltage Ui of the cell measured at step a), of value C_rate, of a value Umin defined as being the lowest value of the voltages Ui measured at step a), of a value Umax defined as being the highest voltage of the voltages Ui measured at step b), and of a value Umoy defined as being the average of the voltages Ui measured at step b.

\* \* \* \* \*